(12) United States Patent
Yuasa

(10) Patent No.: US 11,515,186 B2
(45) Date of Patent: Nov. 29, 2022

(54) CEILING CONVEYANCE VEHICLE SYSTEM AND TEMPORARY STORAGE METHOD FOR ARTICLES IN CEILING CONVEYANCE VEHICLE SYSTEM

(71) Applicant: MURATA MACHINERY, LTD., Kyoto (JP)

(72) Inventor: Yoshiki Yuasa, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 344 days.

(21) Appl. No.: 16/754,380

(22) PCT Filed: Sep. 10, 2018

(86) PCT No.: PCT/JP2018/033358
§ 371 (c)(1),
(2) Date: Apr. 8, 2020

(87) PCT Pub. No.: WO2019/087571
PCT Pub. Date: May 9, 2019

(65) Prior Publication Data
US 2020/0243363 A1 Jul. 30, 2020

(30) Foreign Application Priority Data
Nov. 2, 2017 (JP) .............................. JP2017-212597

(51) Int. Cl.
*H01L 21/67* (2006.01)
*H01L 21/677* (2006.01)
(Continued)

(52) U.S. Cl.
CPC ...... *H01L 21/67712* (2013.01); *B65G 1/0457* (2013.01); *B65G 47/61* (2013.01);
(Continued)

(58) Field of Classification Search
CPC ......... H01L 21/67712; H01L 21/67724; H01L 21/6773; H01L 21/67733; H01L 21/67769;
(Continued)

(56) References Cited

U.S. PATENT DOCUMENTS 8,892,278 B2 * 11/2014 Lin .................. H01L 21/67733 414/592
2004/0126208 A1 * 7/2004 Tawyer ............ H01L 21/67733 414/222.02
(Continued)

FOREIGN PATENT DOCUMENTS

| JP | 10-250978 A | 9/1998 |
|---|---|---|
| JP | 3367389 B2 | 1/2003 |

*Primary Examiner* — Mohammed Shamsuzzaman
(74) *Attorney, Agent, or Firm* — Keating & Bennett, LLP

(57) ABSTRACT

An overhead transport vehicle system stores a large number of articles and includes an inclined rail and overhead transport vehicles each including a traveler to travel on the inclined rail, a holder to hold an article, an elevator to raise and lower the holder, a horizontality guide to keep the elevator horizontal or substantially horizontal at the inclined rail, and a controller. Supports are horizontally provided at a same or substantially same height, and the overhead transport vehicles located on the inclined rail are able to transfer the article between them. The overhead transport vehicles transfer the article between the supports and the controller controls the elevator to raise and lower the holder by a raising and lowering amount according to a height distance between the inclined rail and an individual support.

11 Claims, 6 Drawing Sheets

(51) Int. Cl.
  *B65G 1/04* (2006.01)
  *B65G 47/61* (2006.01)
(52) U.S. Cl.
  CPC .... *H01L 21/6773* (2013.01); *H01L 21/67724* (2013.01); *H01L 21/67733* (2013.01)
(58) Field of Classification Search
  CPC .. H01L 21/67715; B65G 1/0457; B65G 47/61
  See application file for complete search history.

(56) References Cited

U.S. PATENT DOCUMENTS

| | | | |
|---|---|---|---|
| 2009/0035102 A1* | 2/2009 | Zimmerhackl ... | H01L 21/67769 |
| | | | 414/800 |
| 2010/0174405 A1* | 7/2010 | Doherty ............ | H01L 21/67733 |
| | | | 700/218 |
| 2012/0114453 A1* | 5/2012 | Ota .................... | H01L 21/67736 |
| | | | 414/281 |
| 2012/0275886 A1* | 11/2012 | Ota .................... | H01L 21/67733 |
| | | | 414/222.08 |
| 2015/0110585 A1* | 4/2015 | Ota .................... | H01L 21/67733 |
| | | | 414/222.13 |
| 2016/0090239 A1* | 3/2016 | Iwasaki ............. | H01L 21/67736 |
| | | | 414/807 |
| 2017/0194182 A1* | 7/2017 | Takai ................. | H01L 21/67733 |
| 2020/0111692 A1* | 4/2020 | Newman ........... | H01L 21/67201 |
| 2022/0289492 A1* | 9/2022 | Hsu .......................... | G01H 1/00 |

* cited by examiner

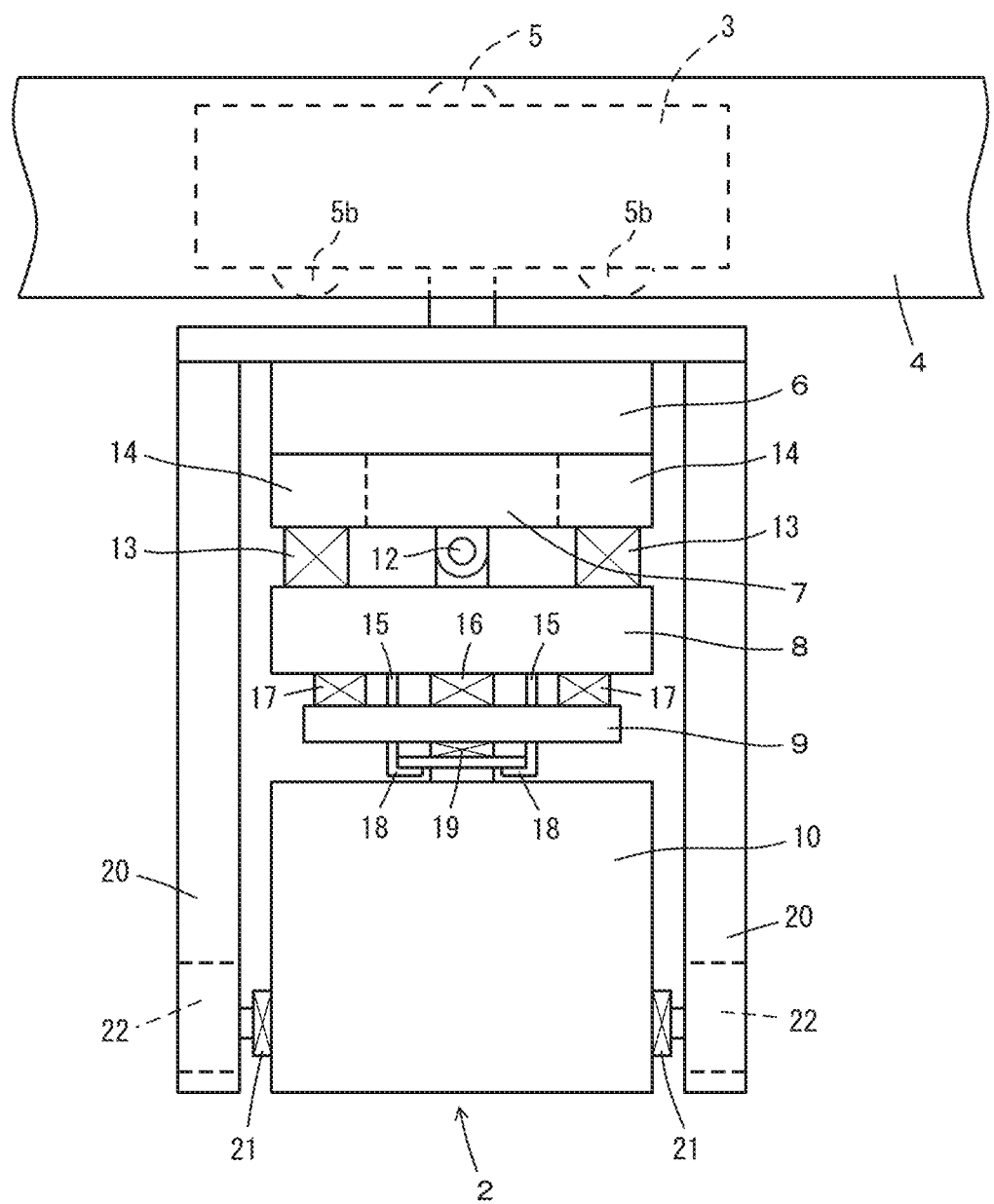
F I G. 1

CEILING CONVEYANCE VEHICLE SYSTEM AND TEMPORARY STORAGE METHOD FOR ARTICLES IN CEILING CONVEYANCE VEHICLE SYSTEM

BACKGROUND OF THE INVENTION

1. Field of the Invention

The present invention relates to an overhead transport vehicle system and a method for temporarily storing articles in the system.

2. Description of the Related Art

When rails for overhead transport vehicles are inclined relative to a horizontal plane, rails in one layer may be branched into two layers, two buildings (facilities) having different ceiling heights may be connected, and other possibilities may be provided. When overhead transport vehicles travelling on rails that are inclined relative to a horizontal plane (inclined rails), it is preferable to keep the articles in an non-tilted orientation. The structure suitable for this purpose has been proposed in JPH10-250978A.

Since overhead transport vehicles cannot ascend at a large inclination angle, the inclined rails have a large length, for example, 10 m to 20 m for ascending 1 m. Therefore, supports for articles can be provided along the inclined rails, and a large number of articles can be temporarily stored.

SUMMARY OF THE INVENTION

Preferred embodiments of the present invention provide overhead transport vehicle systems that each store a large number of articles and use an inclined rail.

An overhead transport vehicle system according to a preferred embodiment of the present invention includes rails including an inclined rail inclined relative to a horizontal plane, overhead transport vehicles, and supports horizontally provided at the same or substantially the same height along the inclined rail. Each of the overhead transport vehicles includes a traveler to travel on the inclined rail, a holder to hold an article, an elevator to raise and lower the holder, a horizontality guide to keep the elevator horizontal or substantially horizontal at the inclined rail, and a controller.

The overhead transport vehicles are configured or programmed to transfer the article between the supports, while the traveler is stopped directly over one of the supports between which the article is to be transferred.

The controller is configured or programmed to control the elevator in order to raise and lower the holder by a raising and lowering amount according to a distance between a stopping position of the traveler on the inclined rail at the time of transfer and the one of the supports between which the article is to be transferred.

A method for storing articles temporarily according to a preferred embodiment of the present invention uses an overhead transport vehicle system that includes rails including an inclined rail inclined relative to a horizontal plane, overhead transport vehicles, and supports horizontally provided at the same or substantially the same height along the inclined rail. Each of the overhead transport vehicles includes a traveler to travel on the inclined rail, a holder to hold an article, an elevator to raise and lower the holder, a horizontality guide to keep the elevator horizontal or substantially horizontal at the inclined rail, and a controller.

The overhead transport vehicles are configured or programmed to transfer the article between the supports, while the traveler is stopped directly over one of the supports between which the article is to be transferred.

The method includes transferring the article between the supports, while the controller controls the elevator to raise and lower the holder by a raising and lowering amount according to a distance between a stopping position of the traveler on the inclined rail at the time of transfer and the one of the supports between which the article is to be transferred.

In the case of overhead transport vehicles, since the tilt angle is relatively small, the inclined rails generally become relatively long even for a relatively small difference in elevation between both ends. According to a preferred embodiment of the present invention, along the inclined rail, buffers, stockers, etc. including supports are provided. When buffers are provided along an inclined rail, a large number of buffers are able to be easily provided. In addition, a stocker including conveyors as the supports may be provided along the inclined rail. In this case, the stocker stores a large number of articles, the overhead transport vehicles transfer the articles between the conveyors, and the conveyors move the articles to and from the inside of the stocker.

The supports are provided along the inclined rail, are horizontal or substantially horizontal, and are positioned or provided at the same or substantially the same height. On the contrary, since the overhead transport vehicles travel on the inclined rail, the raising and lowering amount of the holder to transfer articles changes depending on each support. Therefore, the controller controls the elevator to raise and lower the holder by the raising and lowering amount corresponding to the height difference between the inclined rail and individual supports. Thus, overhead transport vehicles on the inclined rail transfer the articles between individual supports. In this specification, the description about the overhead transport vehicles are applicable to the temporary storing method of articles in the overhead transport vehicle system as they are.

Preferably, for example, the inclined rail is provided to connect a first building and a second building, and buffers and the like are provided between the buildings. Then, a large number of supports are provided between the buildings in a semiconductor plant and so on.

Preferably, for example, the inclined rail includes a first inclined rail provided from a first building to a second building and a second inclined rail provided from the second building to the first building. Further, supports in buffers and the like are provided, and both overhead transport vehicles located on the first inclined rail and on the second inclined rail are able to transfer the article between the supports. Preferably, for example, the first inclined rail does not enter into the second building and define a loop including a tip end between the buildings and that the second inclined rail does not enter into the first building and define a loop including a tip end between the buildings.

There are cases that overhead transport vehicles are not able to mutually cross buildings in a semiconductor plant and due to the difference in the specification of the overhead transport vehicles. In such cases, a first inclined rail and a second inclined rail are able to be connected via buffers and the like between the buildings. Accordingly, two buildings in a semiconductor plant and the like are able to be connected, even if the specifications of the overhead transport vehicles are different.

Preferably, for example, the rails include an upper layer rail connected to one of two horizontal rails via an upwardly inclined rail and a lower layer rail connected to the other of the two horizontal rails via a downwardly inclined rail, and the supports, for example, buffers, are provided, and both overhead transport vehicles located on the upwardly inclined rail and on the downwardly inclined rail are able to transfer the article between the supports.

In some cases, upper and lower multi-layered rails are provided for overhead transport vehicles in a building to increase the transport capacity. In this case, a frequently used solution is that an upper layer rail is connected to a common horizontal rail via upwardly inclined rail and that a lower layer rail is connected to a common horizontal rail via downwardly inclined rail. When buffers and the like are provided and transfer of articles is able to be performed from both two inclined rails, a large number of articles are able to be stored temporarily and each of the inclined rails enables the access to the buffers and the like.

Preferably, for example, the rails include a horizontal rail parallel or substantially parallel to the inclined rail in plan view, and, according to the structure of the supports, both overhead transport vehicles located on the horizontal rail and on the inclined rail are able to transfer the article between the supports. Also, in this case, a large number of articles are able to be stored temporarily and the buffers and the like are able to be accessed from each rail.

Preferably, for example, the supports are attached to horizontal frames parallel or substantially parallel to the inclined rail in plan view and the supports and the frames define a buffer. When supports are attached to horizontal frames to define buffers, the structure of the buffers may be simple. However, the raising and lowering amount of the holder to transfer the articles changes dependently upon each support. According to a preferred embodiment of the present invention, the controller in the overhead transport vehicle controls the holder so that it raises and lowers according to the height difference between the inclined rail and each support. Therefore, if the raising and lowering amount changes dependently upon each support, the article may be transferred between the overhead transport vehicle and the supports.

Preferably, for example, the controller changes the raising and lowering amount of the holder individually for the supports, according to an inclination angle of the inclined rail and a distance between the supports. Regarding the buffers, supports are provided at a constant or substantially constant pitch. It is troublesome to teach the raising and lowering amount for each support. Therefore, the raising and lowering amount for one standard support is determined and those for other supports are, for example, calculated in consideration with the inclined angle of the inclined rail and distance between the supports. Then, the raising and lowering amounts for supports become easily obtainable.

In addition, when the system includes a horizontal rail and horizontal supports so that overhead transport vehicles on the horizontal rail are able to transfer articles between them, the controller sets the raising and lowering amount of the holder for each support constant or substantially constant, instead of changing the raising and lowering amount for each support.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a side view of an overhead transport vehicle and a rail included in a preferred embodiment of the present invention.

DETAILED DESCRIPTION OF THE PREFERRED EMBODIMENTS

Figure 2:
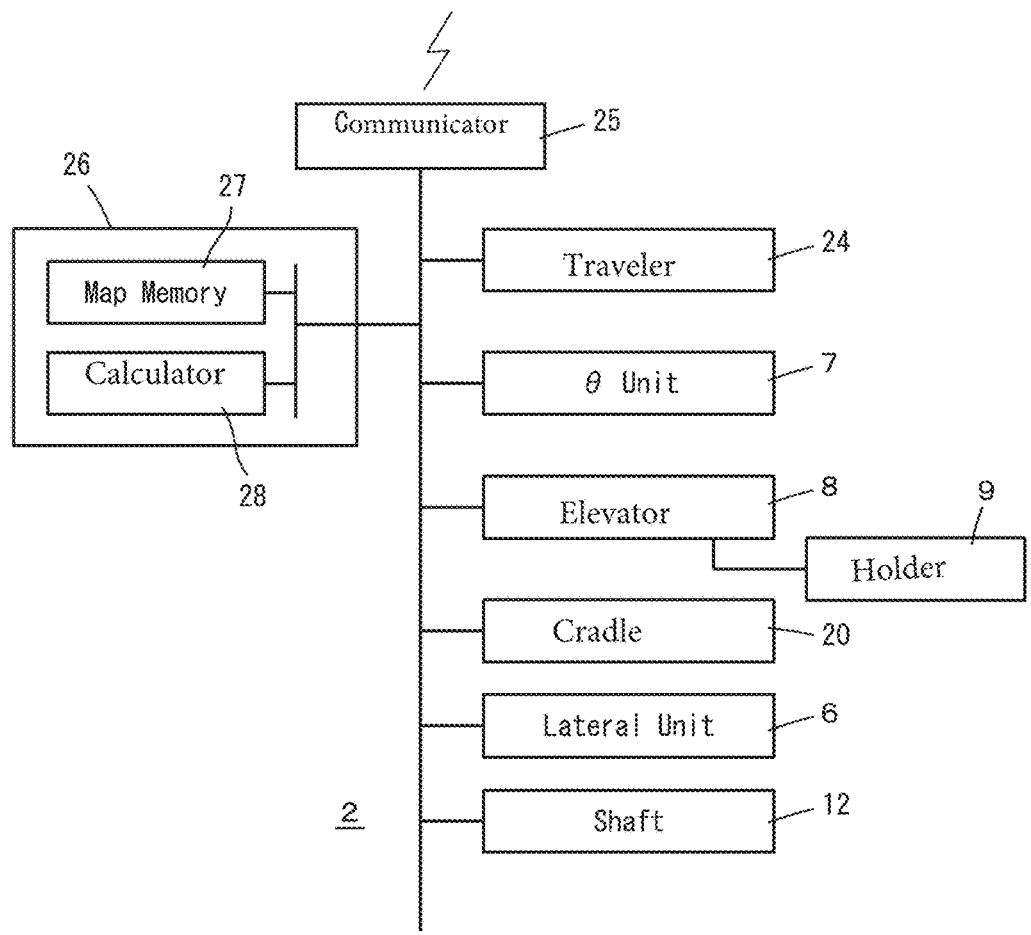
FIG. 2 is a block diagram of the overhead transport vehicle.

Preferred embodiments of the present invention will be described. The scope of the present invention shall be determined based upon the claims with reference to the specification and well-known techniques in the art and according to the construction by the ordinary persons in the art.

FIGS. 1 to 11 illustrate preferred embodiments of the present invention and their versions. In the drawings, the same symbol represents the same component or element. FIG. 1 illustrates an overhead transport vehicle 2 that is supported by and travels on a rail 4 provided in a ceiling space within a clean room and the like. In addition, the traveler 3 of the overhead transport vehicle 2 includes, for example, with a driving wheel 5 and a driven wheel 5*b*. The overhead transport vehicle 2 holds an article 10 by a chuck 18 of a holder 9 configured to open and close and raises and lowers the holder 9 by an elevator 8. In addition, suspensions 15 of the elevator 8 are wound up and released by a hoist not shown and support the holder 9. The overhead transport vehicle 2 rotates the elevator 8 by a theta unit 7 around a vertical axis and laterally moves the theta unit 7 to the article 10 by a lateral unit 6 in a horizontal plane perpendicularly or substantially perpendicularly to the rail 4. The lateral unit 6 and the theta unit 7 may not be provided.

The elevator 8 is supported by the theta unit 7 through a horizontal shaft 12 that is perpendicular or substantially perpendicular to the rail 4. As a result, the elevator 8 is kept horizontal or substantially horizontal while the overhead transport vehicle 2 travels on the inclined rail. To reduce or prevent the elevator 8 to the article 10 from oscillating around the shaft 12, vibration dampers 13, 16, 17, and 19, for example, viscous and elastic gel, dampers, or combinations of a spring and a damper, are provided as shown in FIG. 1. The shaft 12 and the vibration dampers 13, 16, 17, and 19 define a horizontality guide for the elevator 8. Further, some of the vibration dampers 13, 16, 17, and 19 may be omitted. In addition, active vibration damping may be performed when an active vibration damping driver 14 is provided and the vibration damper 13 is replaced with an active vibration damper. For example, a shift sensor is provided in the driver 14, the angle of the elevator 8 is detected with reference to the theta unit 7 around a horizontal axis perpendicular to the travelling direction of the overhead travelling vehicle 2, and the angle is differentiated to convert it to an angular velocity. Further, the vibration damper 13 is replaced with an actuator, for example, a reciprocal-motor, and a damping force in proportion and with the reverse direction to the angular velocity is applied to the elevator 8. Thus, the damping force in proportion to the rotational speed of the elevator 8 is applied to damp the vibration.

The overhead transport vehicle 2 is provided with a pair of front and rear cradles 20, 20 along the travelling direction. The cradles keep the article 10 horizontal or substantially horizontal, with advancing and retracting pushers 21 including a vibration damper by drivers 22. Even when the rail 4 is horizontal or substantially horizontal, the article 10 may be rotated around the shaft 12 and the article 10 may be inclined due to the acceleration and deceleration. This inclination is prevented by the pushers 21, 21. On the inclined rail, the article 10 is inclined with reference to the cradles 20, and the angle between the article 10 and the cradles 20 in the side view is equal or substantially equal to the inclination angle of the rail. Therefore, the drivers 22 drive the pushers 21 to cancel this inclination.

The overhead transport vehicle 2 is not limited to the structure in the preferred embodiments, as long as it may raise and lower the article 10 to transfer from an inclined rail.

FIG. 2 is a block diagram indicating the structure of the overhead transport vehicle 2, a communicator 25 communicates with a controller of the overhead transport system not shown, or the like, and a traveler 24 makes the overhead transport vehicle 2 travel. The lateral unit 6 moves the elevator 8 laterally, and the horizontality guide, for example, the shaft 12, keeps the posture of the elevator 8 horizontal or substantially horizontal. The theta unit 7 rotates the elevator 8, and the elevator 8 raises and lowers the hand 9. The cradles 20 guide the front and rear portions of the article and support the horizontality guide preventing the article from being inclined.

The onboard controller 26 in the overhead transport vehicle 2 stores the topology of the rails (arrangement of the rails) and transfer data for buffers, stockers, and the like, in a map memory 27. In addition, it stores transfer data for each load port. The transfer data include the stop position of the overhead transport vehicle, the elevation distance to raise and lower the holder 9, the lateral movement distance for the article by the lateral unit 6, and the rotation angle of the article by the theta unit 7. When supports of the same type are present at the same or substantially the same height adjacent to or in a vicinity of each other, for example, at the same or substantially the same pitch, complete transfer data for one standard support are stored, for example, instead of storing complete transfer data for each support. Since proximate supports are provided regularly, the difference in the transfer data between the adjacent supports is stored in the map memory 27. A calculator 28 calculates transfer data for supports other than the standard support, according to the transfer data for the standard support and the difference in the transfer data.

Figure 3:
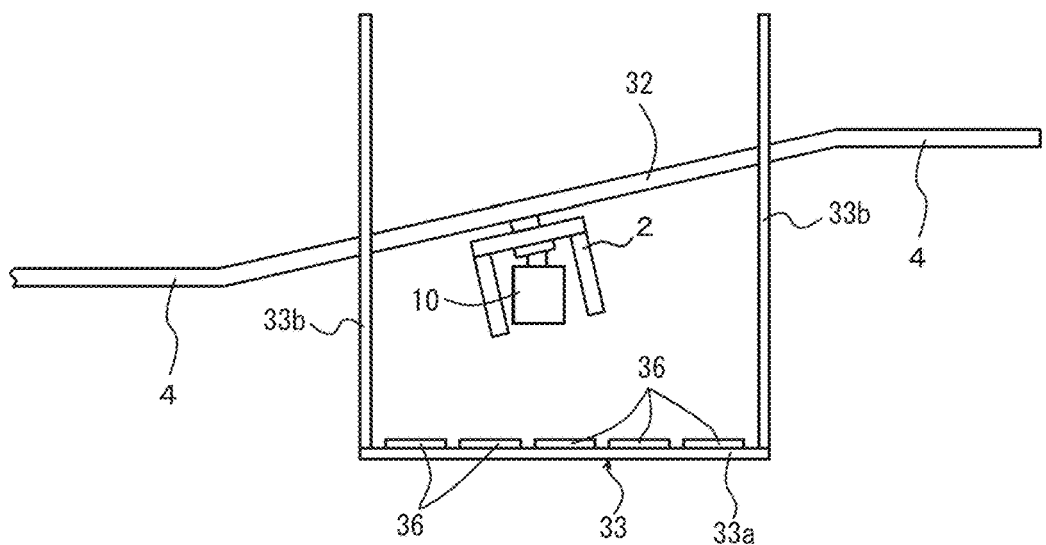
FIG. 3 is a partial side view of a preferred embodiment of the present invention.

FIG. 3 illustrates a preferred embodiment of the present invention of the overhead transport system including the inclined rail, and FIGS. 4 to FIG. 11 illustrate various preferred embodiments of the present invention further developed from this preferred embodiment. In FIG. 3, an inclined rail 32 is provided between horizontal rails 4, 4 for the overhead transport vehicle 2 to travel on the rail. In addition, a buffer 33 is provided along the inclined rail 32. The buffer 33 is provided, for example, with a pair of frames 33a, 33a parallel or substantially parallel to the inclined rail 32 in plan view and poles 33b, 33b, for example, at both ends of the frames 33a, 33a. Further, the pair of frames 33a, 33a are mutually connected by horizontal short side frames not shown (horizontal or substantially horizontal and perpendicular or substantially perpendicular to the frames 33a, 33a). Supports 36 are supported by and over the pair of frames 33a, 33a and the supports 36 are attached to the pair of frames 33a, 33a. In addition, the buffer 33 is provided directly under the inclined rail 32, but it may be provided at a side and lower position. Further, the supports 36 are provided at the same or substantially the same height. When the overhead transport vehicle 2 travels on the inclined rail 32, the holder 9 is raised to the upper bound by the elevator 8. Namely, the position of the holder 9 when the overhead transport vehicle 2 travels is the highest position for the holder 9.

The overhead transport vehicle 2 causes the traveler 24 to stop over the support to transfer the article 10 between it, at a position directly over the support, or at a position shifted sidewise from the above position, and transferring the article between the support 36. Here, the holder 9 raises and lowers to transfer the article 10 between the relevant support 36, by an amount dependent upon the supports 36. Namely, the supports 36 are provided horizontally at the same or substantially the same height, while the inclined rail 32 is tilted from a horizontal plane. Therefore, the distance (the difference in height) between the support 36 for the transfer and the position of the traveler 24 on the inclined rail 32 changes dependently upon the supports 36. In other words, consider an overhead transport vehicle 2, stopping the traveler 24 directly over the support 36, to transfer the article 10 between it. At this state of the overhead transport vehicle, the distance (the difference in height) between the bottom surface of the article 10, held by the holder 9 that is raised to the upper bound, and the relevant support 36 is different according to the supports 36. The controller 26 controls the elevator 8 so that the raising and lowering stroke of the holder 9 changes according to the distance. Further, the distance between the supports 36 and the inclined rail 32 is preferably, for example, relatively small as long as article 10 on the leftmost support 36 does not interfere with an article 10 transported by an overhead transport vehicle 2 or the overhead transport vehicle 2 itself.

Figure 4:
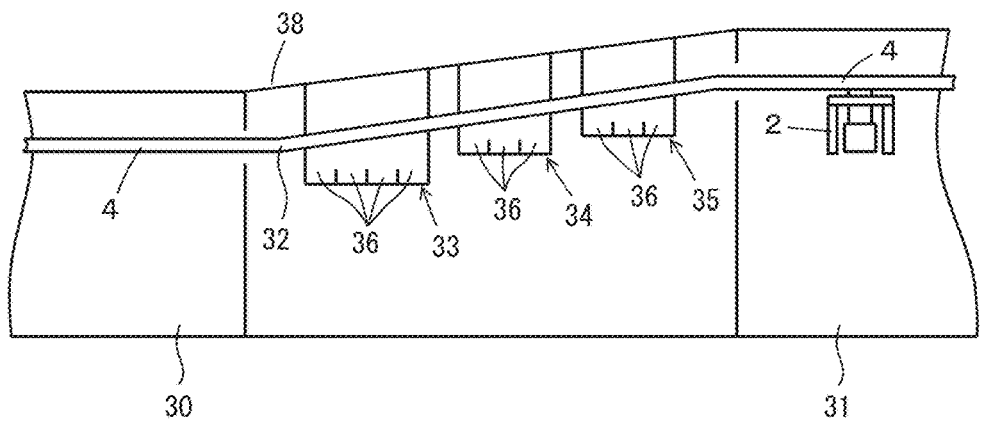
FIG. 4 is a view of a preferred embodiment of the present invention that connects buildings in a semiconductor plant by an inclined rail for the overhead transport vehicles.

When a semiconductor plant is expanded, the rails 4 for the overhead transport vehicles 2 are sometimes different in height between buildings 30, 31. FIG. 4 illustrates a preferred embodiment of the present invention that connects these buildings 30, 31 by an inclined rail 32 for the overhead transport vehicles 2. When the tilt angle of the inclined rail 32 from a horizontal plane is, for example, set to about 3°, then, since tan(3°)=0.05, the inclined rail 32 has a length of about 20 m for a difference in height of about 1 m. As a result, buffers 33 to 35 may be provided along the inclined rail 32 to store a large number of articles temporarily.

The buffers 33 to 35 are side-track buffers provided sidewise and beneath the inclined rail 32. Each of these buffers includes horizontal supports 36, and the buffers 33 to 35 are provided, for example, at both sides of the inclined rail 32. Instead of the side-track buffers, under-track buffers may be provided directly under the inclined rail 32. Further, the buffers may be provided at both sides of the rail and also directly under the rail. In addition, the ceiling 38 of the passage extends between the buildings 30, 31.

Figure 5:
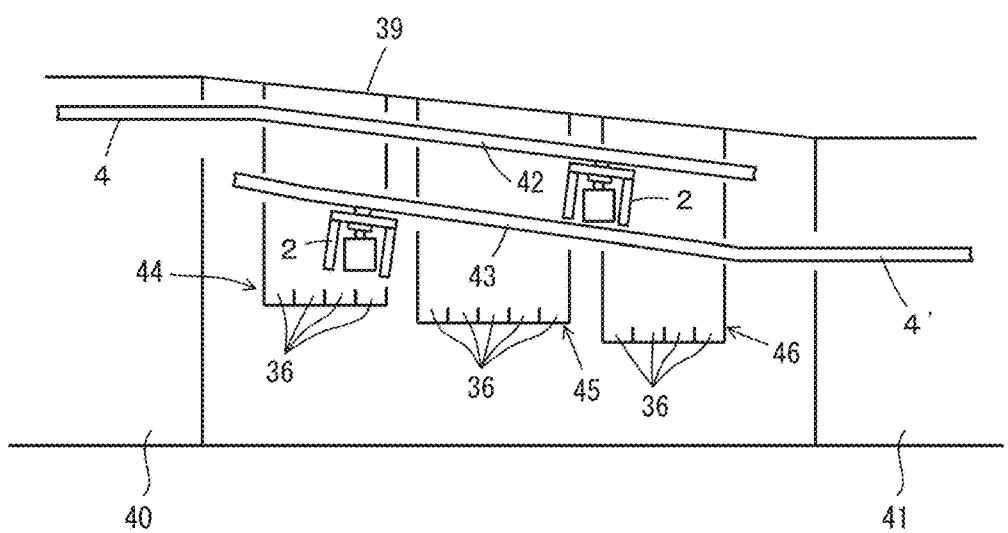
FIG. 5 is a view of a preferred embodiment of the present invention that connects buildings in a semiconductor plant by two-layered inclined rails and buffers.
Figure 6:
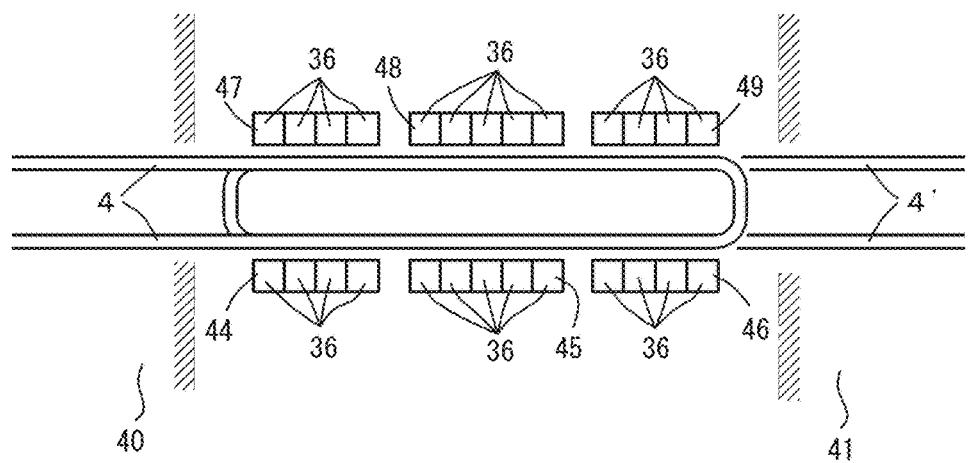
FIG. 6 is a plan view indicating the rails for overhead transport vehicles according to the preferred embodiment of the present invention in FIG. 5.

FIGS. 5 and 6 illustrate a preferred embodiment of the present invention dealing with a situation that the specifications of the overhead transport vehicles are different between buildings 40, 41 and, therefore, they are not able to cross the buildings 40, 41. An inclined rail 42 downwardly inclined relative to the building 40 to the building 41 is connected to a horizontal rail 4 within the building 40. Further, an inclined rail 43 upwardly inclined relative to the building 41 to the building 40 is connected to a horizontal rail 4' within the building 41. Buffers 44 to 49 are provided at positions that enable the overhead transport vehicles 2, both travelling on the inclined rail 42 and on the inclined rail 43, to transfer articles between them. Since the ceiling 39 between the buildings 40, 41 is inclined as shown in FIG. 5, the horizontal rail 4 in the building 40 is not able to be extended under the ceiling 39. Therefore, the inclined rail 42 is connected to the horizontal rail 4. The buffers 44 to 49 have to be provided beneath overhead transport vehicles 2 travelling on the inclined rail 42 and also the inclined rail 43. When the horizontal rail 4' within the building 41 is horizontally extended under the ceiling 39, the buffers 44 and the like have to be positioned at lower positions than those in FIG. 6. Then, the overhead transport vehicles 2 on the inclined rail 42 have a longer raising and lowering stroke to transfer articles 10 between the buffers 44 and the like. Therefore, the inclined rail 43 is connected to the horizontal rail 4' within the building 41, and the inclined rails 42, 43 turn back in a U-shape between the buildings 40, 41. The inclined rails 42, 43 are, for example, overlapped in height direction and parallel or substantially parallel, and the buffers 44 to 49 are provided to enable the overhead transport vehicles on each of the inclined rails to transfer articles between them.

In addition, the buffers 44 to 49 in FIGS. 5 and 6 operate as transfer ports of articles 10 between the overhead transport vehicle system within the building 40 and the overhead transport vehicle system within the building 41. The overhead transport vehicles 2 are not able to cross the buildings 40, 41. Therefore, overhead transport vehicles 2 travelling on the rails 4 and 42 deliver articles on the buffers 44 to 49, and overhead transport vehicles 2 travelling on the rails 4' and 43 receive the articles from the buffers 44 to 49. As a result, articles 10 may be transferred from the overhead transport vehicle system within the building 40 to the overhead transport vehicle system within the building 41. Similarly, articles 10 may be transferred from the overhead transport vehicle system within the building 41 to the overhead transport vehicle system within the building 40. The preferred embodiment in FIGS. 5 and 6 provides large capacity transfer ports including the inclined rails 42 and 43 and the buffers 44 to 49, between the overhead transport vehicle systems within the building 40 and within the building 41.

Figure 7:
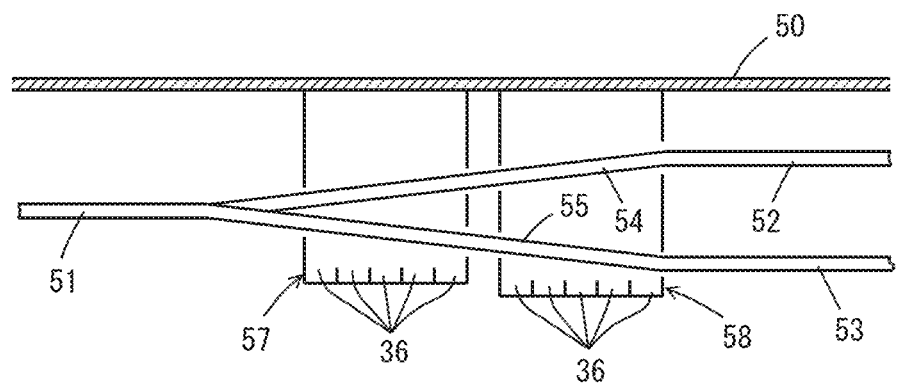
FIG. 7 is a side view of a preferred embodiment of the present invention that provides inclined rails and buffers within a building of a semiconductor plant.
Figure 8:
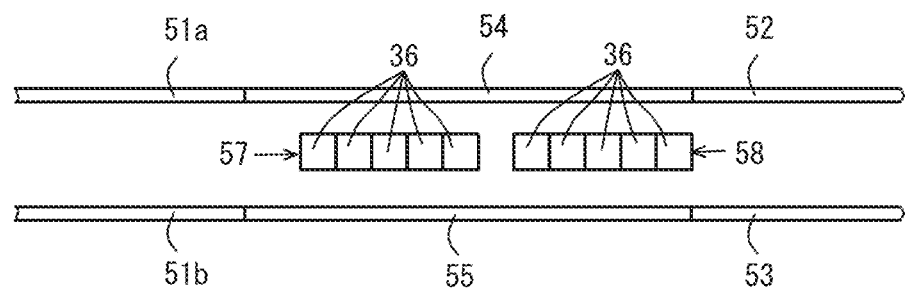
FIG. 8 is a partial plan view of the preferred embodiment of the present invention in FIG. 7.

FIGS. 7 and 8 illustrate a preferred embodiment of the present invention that includes upper and lower multi-layered rails 52 and 53 within a building. To increase the transport capacity of the overhead transport system, a horizontal rail 51a between a pair of horizontal rails 51a, 51b is connected to the horizontal upper rail 52 via an inclined rail 54. In addition, the other horizontal rail 51b is connected to the horizontal lower rail 53 via an inclined rail 55. The inclined rails 54, 55 are, for example, parallel or substantially parallel in plan view, and buffers 57, 58 are provided so that the overhead transport vehicles on each of the inclined rails 54 and 55 are able to transfer articles between them. When the inclined rails 54, 55 are overlapped in height direction, side-track buffers are provided at both sides, for example, and when they are not overlapped, side-track buffers are provided between the inclined rails 54 and 55, for example. Note that a ceiling is indicated by 50.

Figure 9:
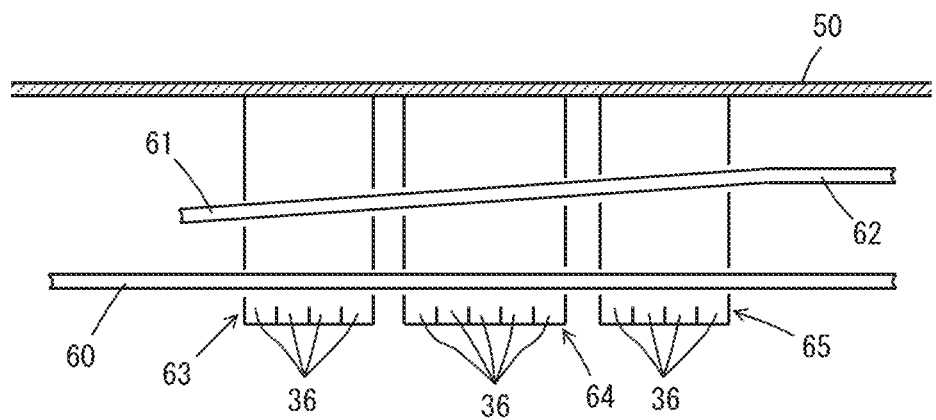
FIG. 9 is a side view of a preferred embodiment of the present invention that provides inclined rails, horizontal rails, and buffers within a building of a semiconductor plant.
Figure 10:
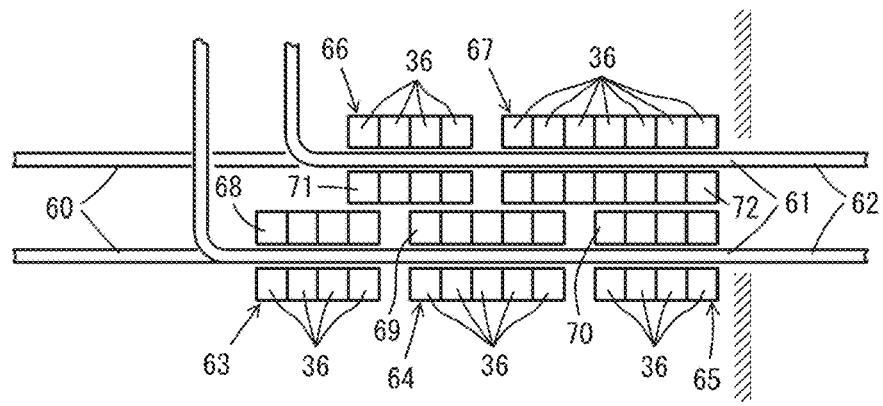
FIG. 10 is a plan view indicating the rails for the overhead transport vehicles according to the preferred embodiment of the present invention in FIG. 9.

FIGS. 9 and 10 illustrate a preferred embodiment of the present invention that includes buffers 63 to 72 to transfer articles between the overhead transport vehicles on an inclined rails 61 and also on a horizontal rails 60. The right ends of the inclined rails 61 are connected to horizontal rails 62 and they change the direction at the left ends, as shown in FIG. 10. The rails 60, 61, and 62 include a pair of rails respectively, and, as shown in FIG. 10, side-track buffers 63 to 72 are provided at both sides of the rails 60 and 61.

Figure 11:
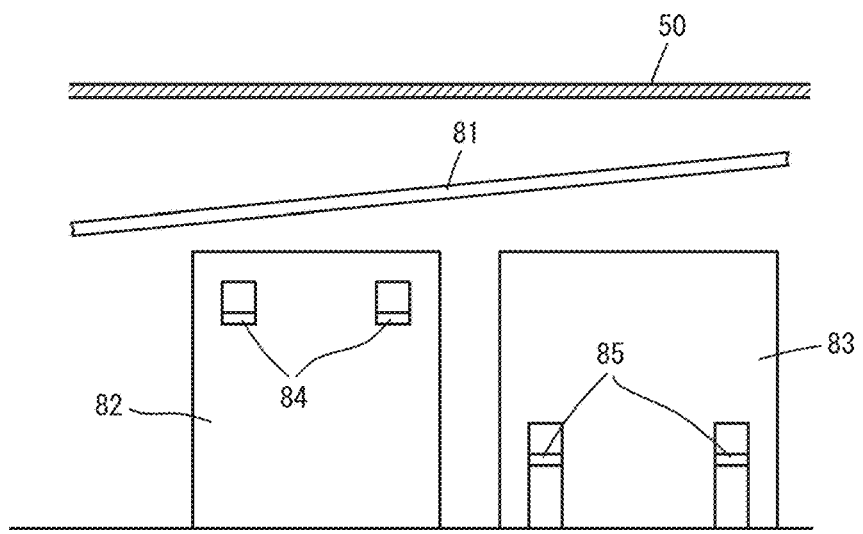
FIG. 11 is a side view indicating an inclined rail, a stocker, and processing equipment.

FIG. 11 illustrates a preferred embodiment of the present invention that enables the overhead transport vehicles on an inclined rail 81 to transfer articles between loading and exporting conveyors 84 of a stocker 82 and also between load ports 85 of processing equipment 83. The processing equipment 83 is an outside object for the overhead transport system to transfer articles between it and is not a part of the overhead transport system. For example, two conveyors 84 are horizontally provided at the same or substantially the same height, and the pitch between them is known to the system. Thus, the controller in the overhead transport vehicle is able to calculate a raising and lowering amount for one conveyor from that for the other conveyor, according to the inclination angle of the inclined rail 81 and the pitch. The processing equipment 83 has plural horizontal load ports 85 at the same or substantially the same height. The arrangement pitch between them is known to the system, and similarly, a raising and lowering amount for one load port is able to be converted to those for other load ports. Therefore, the raising and lowering amounts for conveyors 84 and the load ports 85 are easily determined.

Figure 12:
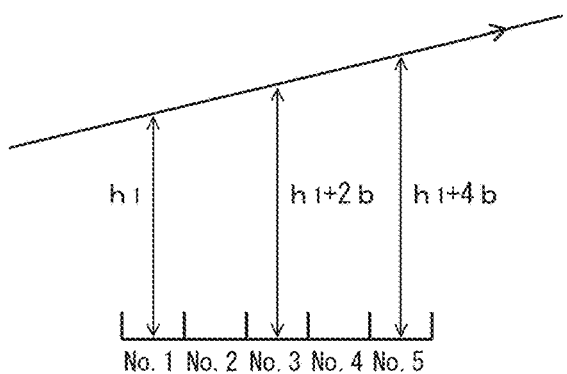
FIG. 12 is a diagram indicating an algorithm for determining raising and lowering amounts to supports from an inclined rail.

FIG. 12 illustrates the calculation of transfer data between supports other than a standard support. When the transfer data are not equal or substantially equal among neighboring supports, they are usually different in the raising and lowering amount. When the supports are regularly provided at a constant or substantially constant pitch, the raising and lowering amount changes by a constant or substantially constant difference b, when the address of supports (the ordered number of supports) changes by one. For example, when the standard support of No. 1 has a raising and lowering amount h1, the third support has the amount of h1+2b, the fifth support has the amount of h1+4b, and the nth support has the amount of h1+(n−1)b. As a result, the calculation of raising and lowering amounts for neighboring supports becomes simple. Further, instead of calculating the raising and lowering amount for every transfer, pre-calculated raising and lowering amounts are able to be stored in the map memory for respective supports.

Figure 13:
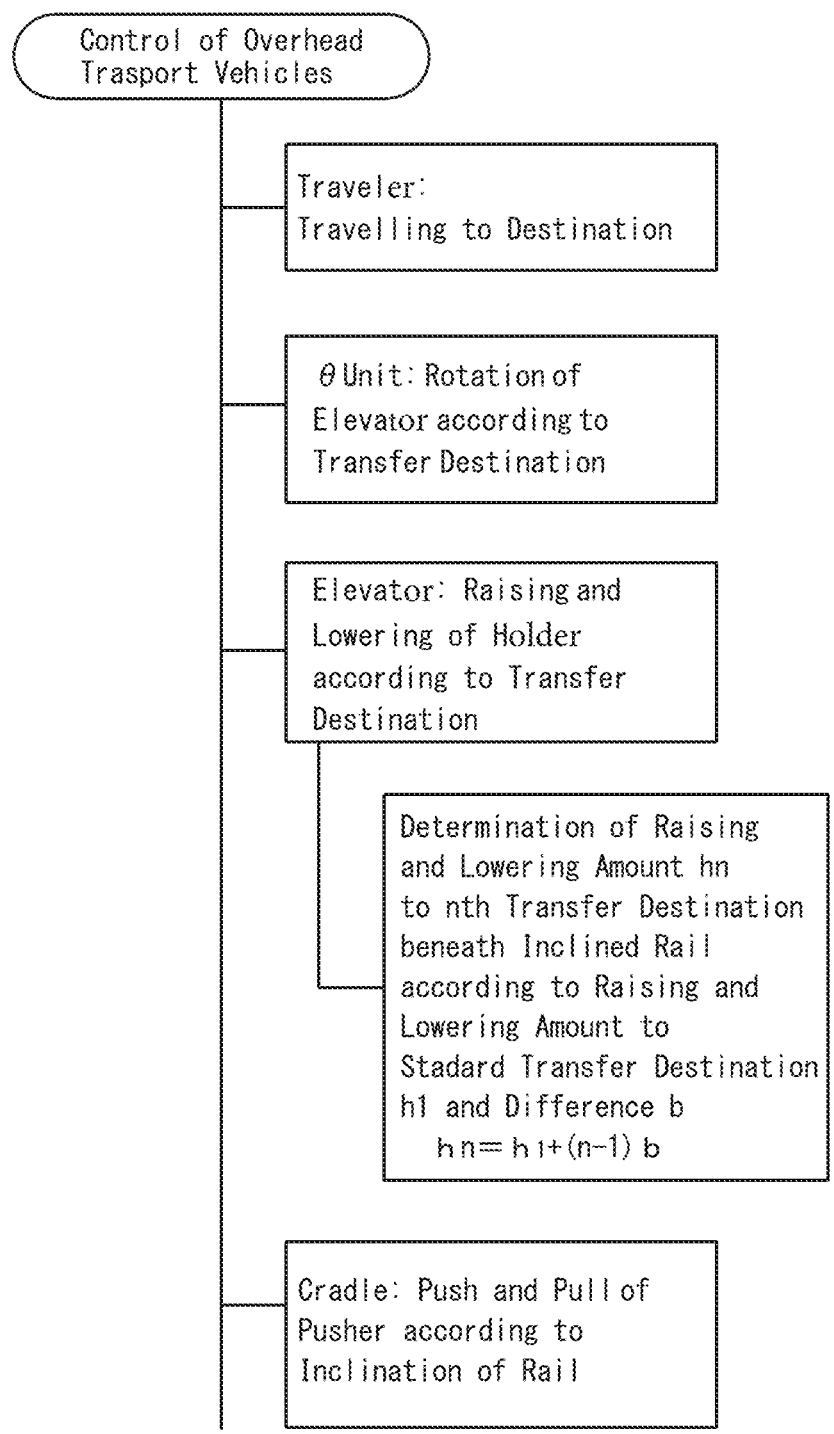
FIG. 13 is a diagram indicating a control algorithm for overhead transport vehicles.

FIG. 13 illustrates the control algorithm of the overhead transport vehicles 2. The traveler performs travelling to a destination (support), the theta unit rotates an article around a vertical axis according to the support as the destination. The elevator raises and lowers the article by a raising and lowering amount according to the support. As already shown in FIG. 12, when a support having an address 1 is the standard, for example, and when the difference in raising and lowering amount between adjacent supports is b, the raising and lowering amount for a neighboring support (address n) is determined as h1+(n−1)b. Further, the cradles advance and retract the pushers to keep the article not tilted in inclined rails.

The preferred embodiments achieve the following technical advantages.

Since buffers and stockers are provided along inclined rails, the overhead transport vehicle system has an increased capacity to temporarily store articles.

A large number of buffers are provided with usage of the inclined rails between buildings within semiconductor plants and the like. Further, articles are exchanged via the buffers between buildings that do not allow overhead transport vehicles to cross over them.

When a pair of horizontal rails are connected to an upper layer rail and a lower layer rail through two inclined rails, a large number of buffers are provided along the inclined rails.

Raising and lowering amounts for supports are calculated from the raising and lowering amount for a standard support, arrangement pitch between the supports, and the inclination angle of the rails. Therefore, the raising and lowering amount for every support is not needed to be measured.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An overhead transport vehicle system comprising:
   rails including an inclined rail inclined relative to a horizontal plane;
   overhead transport vehicles that each includes:
      a traveler to travel on the inclined rail;
      a holder to hold an article;
      an elevator to raise and lower the holder;
      a horizontality guide to keep the elevator horizontal or substantially horizontal at the inclined rail;
      a pair of front and rear cradles along a travelling direction to keep the article horizontal or substantially horizontal; and
      a controller; and
   supports horizontally provided at a same or substantially same height along the inclined rail; wherein
   the overhead transport vehicles are configured or programmed to transfer the article between the supports, while the traveler is stopped directly over one of the supports between which the article is to be transferred;
   the controller is configured or programmed to control the elevator in order to raise and lower the holder by a raising and lowering amount according to a distance between a stopping position of the traveler on the inclined rail at the time of transfer and the one of the supports; and
   a difference in the raising and lowering amount between adjacent supports is b, the raising and lowering amount for a neighboring support (address n) is determined as h1+(n−1)b, where h1 is the raising and lowering amount of a support of the supports having address n=1.

2. The overhead transport vehicle system according to claim 1, wherein
   the inclined rail is provided to connect a first building and a second building; and
   the supports are provided between the first building and the second building.

3. The overhead transport vehicle system according to claim 1, wherein the inclined rail includes:
   a first inclined rail provided from a first building to a second building; and
   a second inclined rail provided from the second building to the first building; and
   the overhead transport vehicles located on the first inclined rail and on the second inclined rail are able to transfer the article between the supports.

4. The overhead transport vehicle system according to claim 1, wherein
   the rails include an upper layer rail connected to one of two horizontal rails via an upwardly inclined rail and a lower layer rail connected to the other of the two horizontal rails via a downwardly inclined rail; and
   the overhead transport vehicles located on the upwardly inclined rail and on the downwardly inclined rail are able to transfer the article between the supports.

5. The overhead transport vehicle system according to claim 1, wherein
   the rails include a horizontal rail parallel or substantially parallel to the inclined rail in plan view; and
   the overhead transport vehicles located on the horizontal rail and on the inclined rail are able to transfer the article between the supports.

6. The overhead transport vehicle system according to claim 1, wherein the supports are attached to horizontal frames parallel or substantially parallel to the inclined rail in plan view, and the supports and the frames define a buffer.

7. The overhead transport vehicle system according to claim 1, further comprising a stocker including conveyors defining the supports.

8. The overhead transport vehicle system according to claim 1, wherein the controller changes the raising and lowering amount of the holder individually for the supports, according to an inclination angle of the inclined rail and a distance between the supports.

9. The overhead transport vehicle system according to claim 8, wherein
   the rails include a horizontal rail;
   the overhead transport vehicle system further comprises second supports that are horizontal or substantially horizontal and at a same or substantially same height and enable the overhead transport vehicles on the horizontal rail to transfer the article between the second supports; and
   the controller is configured or programmed to set raising and lowering amounts of the holder for the second supports to be constant or substantially constant.

10. The overhead transport vehicle system according to claim 3, wherein both the first inclined rail and the second inclined rail turn back in a U-shape between the first building and the second building.

11. A method for storing articles temporarily in an overhead transport vehicle system,
   the overhead transport vehicle system including:
      rails including an inclined rail inclined relative to a horizontal plane;
      overhead transport vehicles that each includes:
         a traveler that is able to travel on the inclined rail;
         a holder to hold an article;
         an elevator to raise and lower the holder;
         a horizontality guide to keep the elevator horizontal or substantially horizontal at the inclined rail;

a pair of front and rear cradles along a travelling direction to keep the article horizontal or substantially horizontal; and a controller; and supports horizontally provided at a same or substantially same height along the inclined rail; wherein the overhead transport vehicles are configured or programmed to transfer the article between the supports, while the traveler is stopped directly over one of the supports between which the article is to be transferred;

the method comprising:

transferring the article between the supports; and controlling by the controller the elevator to raise and lower the holder by a raising and lowering amount according to a distance between a stopping position of the traveler on the inclined rail at a time of transfer and the one of the supports; wherein a difference in the raising and lowering amount between adjacent supports is b, the raising and lowering amount for a neighboring support (address n) is determined as h1+(n−1)b, where h1 is the raising and lowering amount of a support of the supports having address n=1.

\* \* \* \* \*